United States Patent
Krick

(10) Patent No.: US 8,924,817 B2
(45) Date of Patent: Dec. 30, 2014

(54) METHOD AND APPARATUS FOR CALCULATING ERROR CORRECTION CODES FOR SELECTIVE DATA UPDATES

(75) Inventor: Robert Krick, Longmont, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1027 days.

(21) Appl. No.: 12/893,501

(22) Filed: Sep. 29, 2010

(65) Prior Publication Data

US 2012/0079350 A1 Mar. 29, 2012

(51) Int. Cl.
*G11C 29/00* (2006.01)
*H03M 13/00* (2006.01)
*H03M 13/05* (2006.01)
*G06F 11/10* (2006.01)
*H03M 13/09* (2006.01)

(52) U.S. Cl.
CPC ......... *G06F 11/1064* (2013.01); *H03M 13/611* (2013.01); *H03M 13/093* (2013.01); *H03M 13/05* (2013.01)
USPC ........... 714/763; 714/752; 711/141; 711/144; 711/145

(58) Field of Classification Search
None
See application file for complete search history.

(56) References Cited

U.S. PATENT DOCUMENTS

| | | | | |
|---|---|---|---|---|
| 5,961,660 | A * | 10/1999 | Capps et al. ................. | 714/763 |
| 7,752,505 | B2 * | 7/2010 | Gschwind et al. ............ | 714/52 |
| 8,095,831 | B2 * | 1/2012 | Moyer et al. .................. | 714/57 |
| 8,266,498 | B2 * | 9/2012 | Moyer .......................... | 714/758 |
| 8,291,305 | B2 * | 10/2012 | Moyer et al. .................. | 714/799 |
| 2006/0156182 | A1 * | 7/2006 | Regev et al. .................. | 714/758 |
| 2009/0183056 | A1 * | 7/2009 | Aston ........................... | 714/799 |
| 2011/0289380 | A1 * | 11/2011 | Wilkerson et al. ............ | 714/763 |

OTHER PUBLICATIONS

Cache Memory, Department of Computer Science, University of Newfoundland, CS 3725, Jul. 6, 2007, http://web.archive.org/web/20070706214034/http://web.cs.mun.ca~paul/cs3725/material/web/notes/node3.html.*

* cited by examiner

*Primary Examiner* — Justin R Knapp

(57) ABSTRACT

The present invention provides a method and apparatus for selectively updating error correction code bits. One embodiment of the method includes determining a first subset of a plurality of error correction code bits formed from a plurality of data bits in response to changes in a first subset of the data bits. The first subset of the plurality of error correction code bits is less than all of the plurality of error correction code bits.

13 Claims, 4 Drawing Sheets

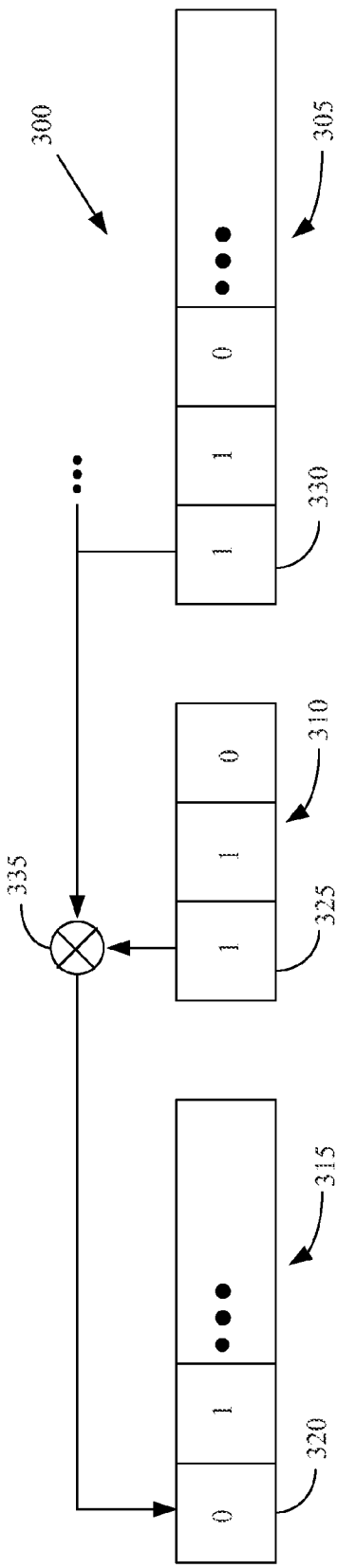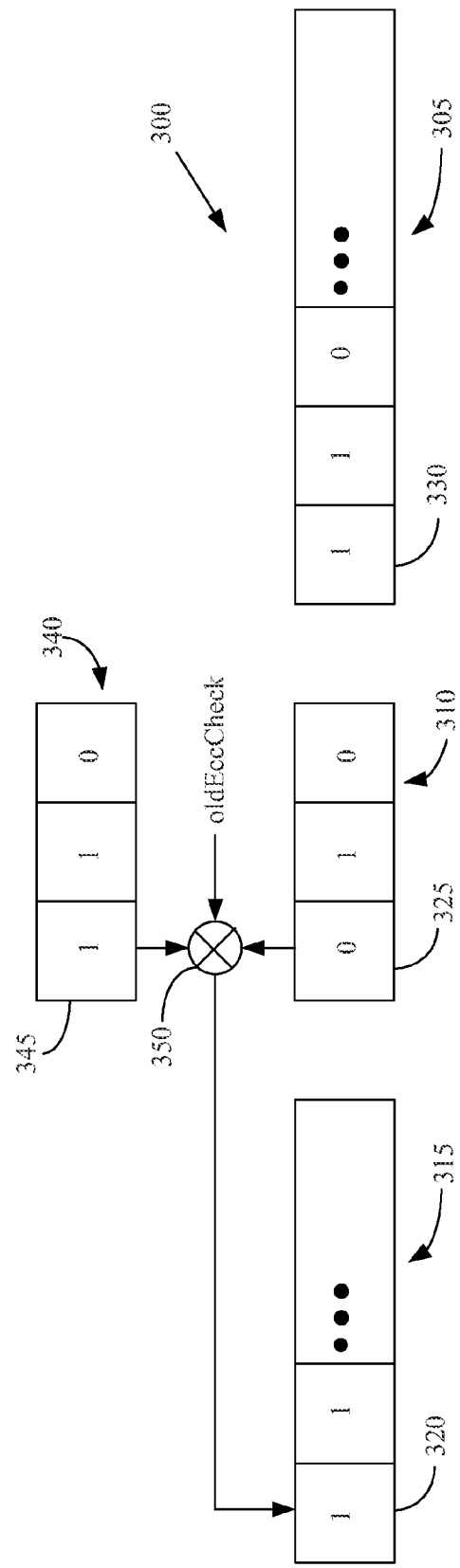
Figure 3A
Figure 3B

METHOD AND APPARATUS FOR CALCULATING ERROR CORRECTION CODES FOR SELECTIVE DATA UPDATES

BACKGROUND OF THE INVENTION

1. Field of the Invention

This invention relates generally to processor-based systems, and, more particularly, to calculating error correction codes for selective data updates in processor-based systems.

2. Description of the Related Art

Processor systems implement various memory elements and are nearly constantly reading, writing, modifying, and/or updating these memory elements during operation. In order for the processor system to operate correctly, the information stored in memory must be accurate and must be conveyed accurately from the memory to the devices that are going to use the information stored in the memory. However, errors can (and inevitably do) creep in and corrupt data stored in the memory. Moreover, transmission errors may corrupt accurate information as it is being transmitted from the memory to other devices within the processor system. Conventional processor systems therefore implement error detection and correction functionality.

Error detection and correction techniques use redundant information to identify corrupted bits and in some cases to restore the value of the bit to its correct value. For example, an additional number of bits can be added to selected blocks of data for the implementation of error correcting codes (ECCs), which may sometimes also be called error correction codes or error correcting circuits. The additional ECC bits contain information about the data that can be used to correct problems encountered while trying to access the real data bits. The ECC bits can be generated by applying logical operations such as XOR to combinations of the data bits that are selected according to a particular error correcting algorithm. When the data bits and the ECC bits are read out of memory, error detection/correction logic can use the data bits and the ECC bits to detect the presence of errors in the data bits and to correct some or all of these errors. For example, the Reed-Solomon algorithm can detect and correct large numbers of missing bits of data and this algorithm requires the least number of extra ECC bits to recover a given number of corrupted data bits.

The latency to compute ECC bits for data stored in a memory has a number of logic levels. For a read-modify-write operation, the data read from the memory is corrected, the data is changed, and then new ECC values are computed before writing the data back to memory. This error correction latency can represent significant and sometimes unnecessary latency and/or processing overhead. For example, many processing devices utilize caches to reduce the average time required to access information stored in a memory. A cache is a smaller and faster memory that stores copies of instructions and/or data from a main memory that are expected to be used relatively frequently, e.g., by a central processing unit (CPU). The cache uses a tag array that indicates the main memory address of the stored copy of the instruction and/or data. The tag array also includes one or more bits to indicate the current state of the information stored in each line in the cache. For example, the tag array may include a valid bit that indicates whether the corresponding line in the cache includes valid data.

Read-modify-write operations are commonly used to perform state updates in a cache memory. For example, a read-modify-write operation can be used to clear the valid bit when a line is invalidated. The read-modify-write operation does not, however, necessarily change any of the other bits in the tag array. For example, the main memory address indicated in the tag array does not change when the status of the line changes. Nevertheless, performing the read-modify-write operation on the tag array requires that all of the ECC bits for the updated line in the tag array be re-computed before writing the data back to memory. The number of state bits in the tag array is typically much smaller than the number of bits that are used to store the main memory addresses. Re-computing all of the ECC bits for every read-modify-write operation performed on the tag array therefore generates unnecessary latency and processing overhead.

SUMMARY OF EMBODIMENTS OF THE INVENTION

The disclosed subject matter is directed to addressing the effects of one or more of the problems set forth above. The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one embodiment, a method is provided for selectively updating error correction code bits. One embodiment of the method includes calculating a first subset of a plurality of error correction code bits formed from a plurality of data bits in response to changes in a first subset of the data bits. The first subset of the plurality of error correction code bits is less than all of the plurality of error correction code bits.

In another embodiment, an apparatus is provided for selectively updating error correction code bits. One embodiment of the apparatus includes memory for storing a plurality of data bits and a plurality of error correction code bits formed using the data bits. This embodiment of the apparatus also includes logic that is communicatively coupled to a first subset of the data bits and a first subset of the error correction code bits. The logic is configured to calculate the first subset of the error correction code bits in response to changes in the first subset of the data bits. The first subset of the plurality of error correction code bits is less than all of the plurality of error correction code bits.

In yet another embodiment, an apparatus provided for selectively updating error correction codes in a tag array. One embodiment of the apparatus includes a tag array that includes at least one state bit, a plurality of address bits, and a plurality of error correction code bits formed using said at least one state bit and the address bits. The apparatus also includes logic that is communicatively coupled to the state bit(s) and a first subset of the error correction code bits. The logic is configured to calculate the first subset of the error correction code bits in response to changes in the state bit(s). A second subset of the error correction code bits is not calculated in response to the changes in one or more of the state bits.

BRIEF DESCRIPTION OF THE DRAWINGS

The disclosed subject matter may be understood by reference to the following description taken in conjunction with the accompanying drawings, in which like reference numerals identify like elements, and in which:

FIG. 3A conceptually illustrates one exemplary embodiment of a line in a tag array;

FIG. 3B conceptually illustrates the exemplary embodiment of the line in the tag array following a change in a state bit.

Figure 1:
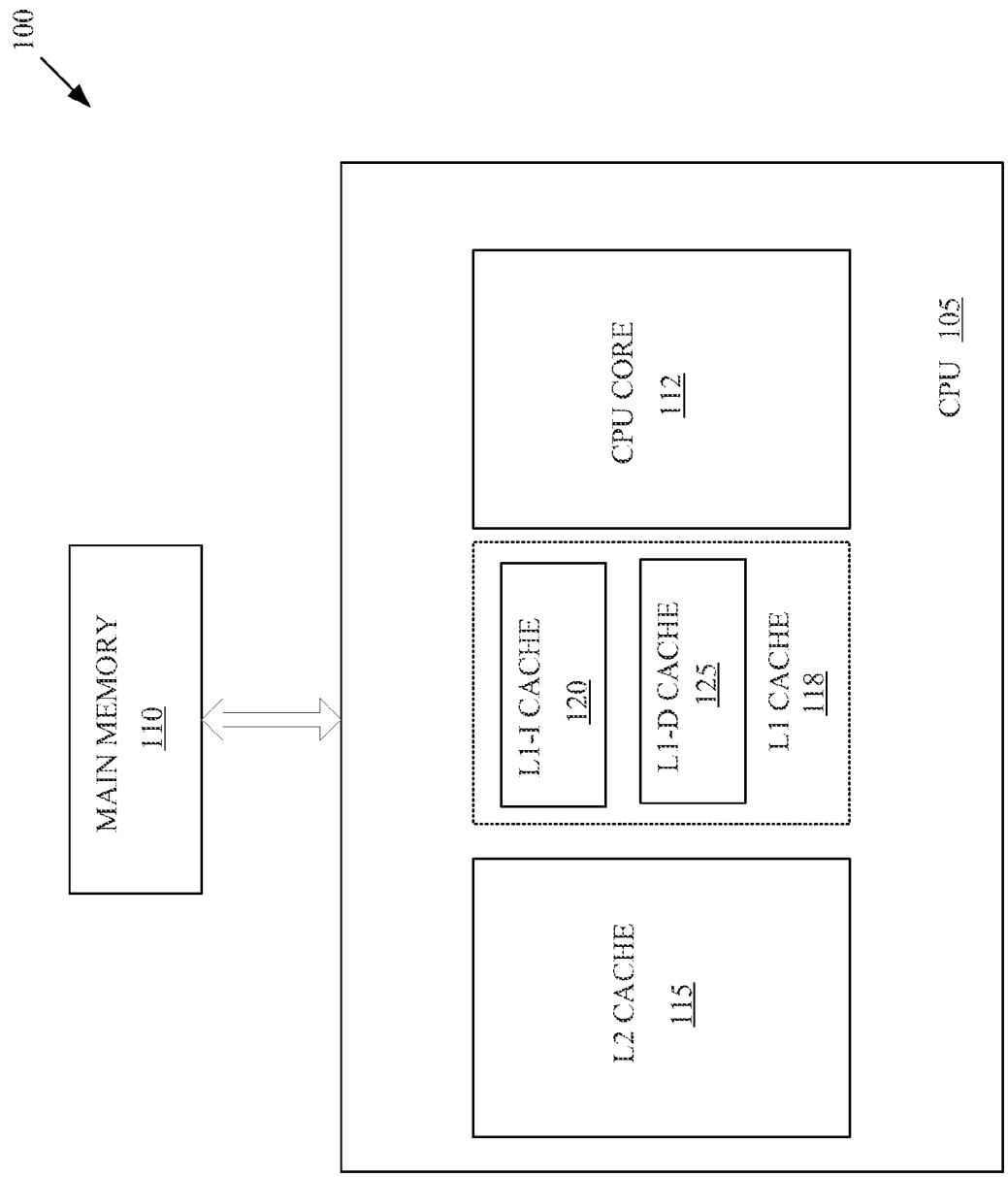
FIG. 1 conceptually illustrates one exemplary embodiment of a semiconductor device.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 conceptually illustrates one exemplary embodiment of a semiconductor device 100 that may be formed in or on a semiconductor wafer (or die). The semiconductor device 100 may formed in or on the semiconductor wafer using well known processes such as deposition, growth, photolithography, etching, planarising, polishing, annealing, and the like. In the illustrated embodiment, the device 100 includes a processor which, in the exemplary embodiment, is embodied as a central processing unit (CPU) 105 that is configured to access instructions and/or data that are stored in the main memory 110. However, as will be appreciated by those of ordinary skill the art the CPU 105 is intended to be illustrative and alternative embodiments may include other types of processor such as a graphics processing unit (GPU), a digital signal processor (DSP), an accelerated processing unit (APU), a co-processor, an applications processor, and the like. In the illustrated embodiment, the CPU 105 includes a CPU core 112 that is used to execute the instructions and/or manipulate the data. The CPU 105 also implements a hierarchical (or multilevel) cache system that is used to speed access to the instructions and/or data by storing selected instructions and/or data in the caches. However, persons of ordinary skill in the art having benefit of the present disclosure should appreciate that alternative embodiments of the device 100 may implement different configurations of the CPU 105, such as configurations that use external caches.

The illustrated cache system includes a level 2 (L2) cache 115 for storing copies of instructions and/or data that are stored in the main memory 110. In the illustrated embodiment, the L2 cache 115 is 16-way associative to the main memory 105 so that each line in the main memory 105 can potentially be copied to and from 16 particular lines (which are conventionally referred to as "ways") in the L2 cache 105. However, persons of ordinary skill in the art having benefit of the present disclosure should appreciate that alternative embodiments of the main memory 105 and/or the L2 cache 115 can be implemented using any associativity. A tag array (not shown in FIG. 1) may be used to keep track of the state of the lines/ways and the main memory addresses of the information stored in the lines/ways. Relative to the main memory 105, the L2 cache 115 may be implemented using smaller and faster memory elements. The L2 cache 115 may also be deployed logically and/or physically closer to the CPU core 112 (relative to the main memory 110) so that information may be exchanged between the CPU core 112 and the L2 cache 115 more rapidly and/or with less latency.

The illustrated cache system also includes an L1 cache 118 for storing copies of instructions and/or data that are stored in the main memory 110 and/or the L2 cache 115. Relative to the L2 cache 115, the L1 cache 118 may be implemented using smaller and faster memory elements so that information stored in the lines of the L1 cache 118 can be retrieved quickly by the CPU 105. The L1 cache 118 may also be deployed logically and/or physically closer to the CPU core 112 (relative to the main memory 110 and the L2 cache 115) so that information may be exchanged between the CPU core 112 and the L1 cache 118 more rapidly and/or with less latency (relative to communication with the main memory 110 and the L2 cache 115). One or more tag arrays (not shown in FIG. 1) may be used to keep track of the state of the lines/ways and the main memory addresses of the information stored in the lines/ways. Persons of ordinary skill in the art having benefit of the present disclosure should appreciate that the L1 cache 118 and the L2 cache 115 represent one exemplary embodiment of a multi-level hierarchical cache memory system. Alternative embodiments may use different multilevel caches including elements such as L0 caches, L1 caches, L2 caches, L3 caches, and the like.

In the illustrated embodiment, the L1 cache 118 is separated into level 1 (L1) caches for storing instructions and data, which are referred to as the L1-I cache 120 and the L1-D cache 125. Separating or partitioning the L1 cache 118 into an L1-I cache 120 for storing only instructions and an L1-D cache 125 for storing only data may allow these caches to be deployed closer to the entities that are likely to request instructions and/or data, respectively. Consequently, this arrangement may reduce contention, wire delays, and generally decrease latency associated with instructions and data. In one embodiment, a replacement policy dictates that the lines in the L1-I cache 120 are replaced with instructions from the L2 cache 115 and the lines in the L1-D cache 125 are replaced with data from the L2 cache 115. However, persons of ordinary skill in the art should appreciate that alternative embodiments of the L1 cache 118 may not be partitioned into separate instruction-only and data-only caches 120, 125.

The semiconductor device also implements error correction codes (ECCs) that are used to detect and (if possible) correct errors in bits that are stored in the memories 110, 115, 118 or following transmission of the bits, e.g., to the CPU core 112 for processing. Error correction codes may be calculated for selected lines, blocks, registers, or other portions of the memories 110, 115, 118. For example, a set of error correction code bits can be calculated using the bits in each line of a tag array in the cache memories 115, 118. In one embodiment, some bits within the selected portions of the memories 110, 115, 118 are expected to be updated and/or modified more frequently than other bits within the selected portions. For example, the state bits in a tag array are expected to be updated and/or modified much more frequently than the address bits in the tag array. The CPU 105 may therefore implement dedicated logic (e.g., in the CPU core 112) for updating the ECC bits that depend on the frequently changing bits while leaving the remaining ECC unchanged. Although the dedicated logic may use values of the less frequently changing bits to determine the subset of the ECC bits, one embodiment of the dedicated logic only operates in response to changes in the subset of frequently changing bits and ignores changes in the less frequently changing bits.

Figure 2:
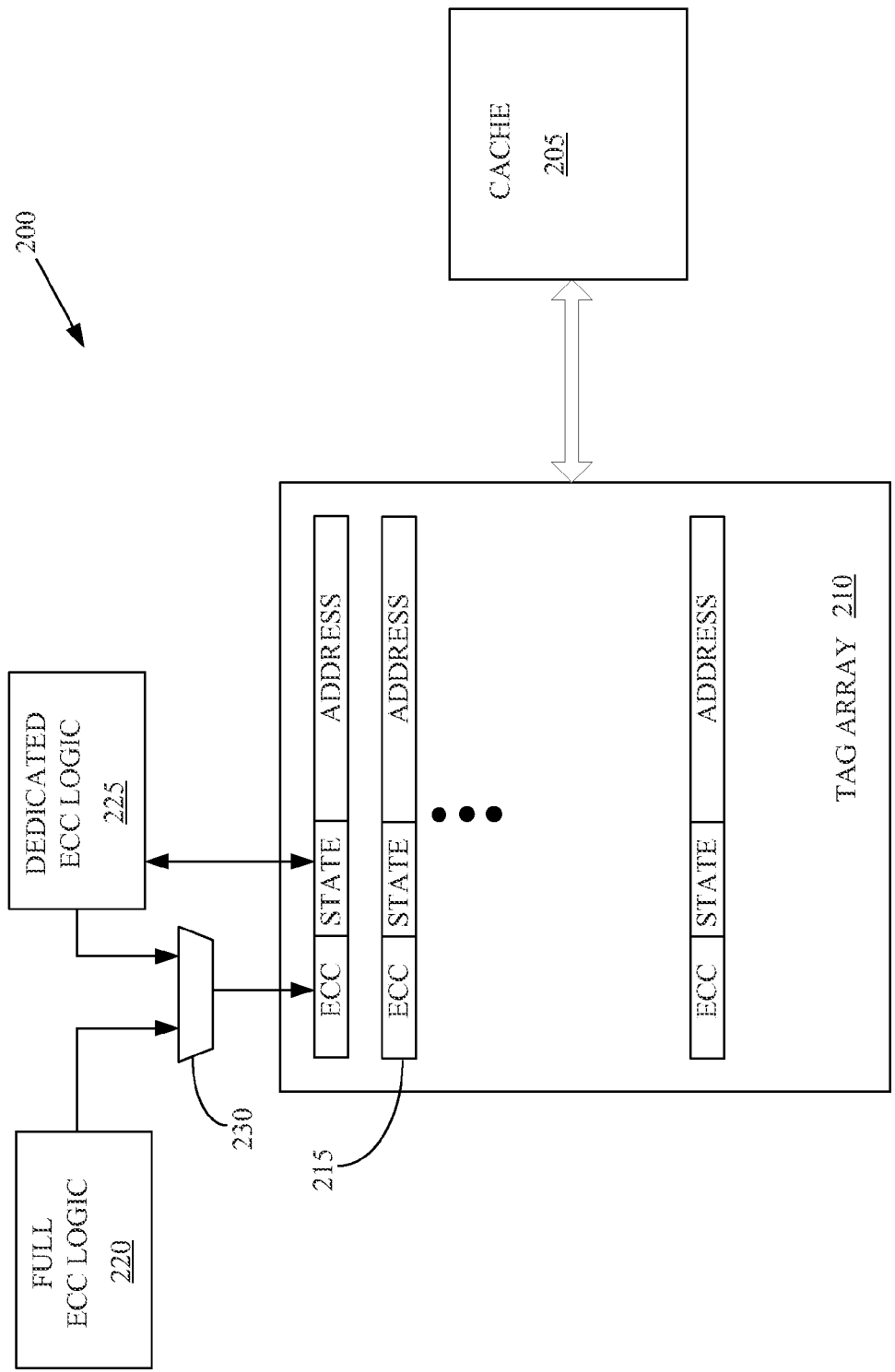
FIG. 2 conceptually illustrates one exemplary embodiment of a portion of a semiconductor device, such as the semiconductor device depicted in FIG. 1.

FIG. 2 conceptually illustrates one exemplary embodiment of a portion 200 of a semiconductor device, such as the semiconductor device 100 depicted in FIG. 1. In the illustrated embodiment, the portion 200 includes a cache 205 and an associated tag array 210. The tag array 210 includes one or more lines 215 (only one indicated by a numeral in FIG. 2) that indicate the connection between lines of the cache 205 and the lines in the main memory (or other cache memory) that include a copy of the data stored in the corresponding line of the cache 205. In the illustrated embodiment, each line 215 includes the address of the location in the associated memory that includes a copy of the data, one or more state bits that are used to indicate the state of the data in the corresponding line of the cache (e.g., whether the cached information is valid), and one or more ECC bits that are used to detect and/or correct errors in either the state bits or the address bits.

Conventional (full) ECC logic 220 is implemented to recompute the ECC bits from scratch when bits in the tag array 210 have changed. In one embodiment, the full ECC logic 220 is used to re-compute the ECC bits in response to detecting changes in the address bits in the cache lines 215 and the state bits in the cache lines 215. However, the state bits are expected to change much more frequently than the address bits in the lines 215. For example, the information in the cache memory 205 may change relatively frequently as the associated processor performs instructions and operations such as read-modify-write operations on the cached information. These operations do not change the address of the data copy stored in the associated memory, but they often result in a change in the state of the cached information. For example, the valid bit in the state information will be flipped back and forth each time the corresponding line of the cache 205 is modified and then written back into the associated memory location.

The latency to compute ECC bits for the lines 215 associated with data stored in the cache 205 has a number of logic levels. For a read-modify-write operation, the data read from the cache 205 is corrected, the data is changed (if necessary), and then new ECC values are computed before writing the data back to the associated memory. These read-modify-write operations are common for state updates in a cache memory such as the cache 205. For example, the valid bit must be cleared when a line is invalidated but all of the other bits are unaffected. The equation for each ECC bit is an XOR of specific data bits and a single data bit may be included in the equation for one or more ECC bits. When the number of bits being changed is small, then it is not necessary to re-compute the ECC bits from scratch using the full ECC logic 220. For example, when a state bit in a line 215 is flipped, it is only necessary to flip the ECC bits that are a function of that state bit.

The device 200 therefore also implements dedicated ECC logic 225 that only computes updated values of ECC bits that involve the state bits and only performs the computation in response to changes in the state bits. In one embodiment, the dedicated logic 225 uses the current values of the ECC bits to detect and correct errors in the data before updating the data in the cache 205 and computing the new values of the ECC bits. This approach may avoid erroneously updating the values of the ECC bits, e.g., in cases where a data bit appears to have changed or flipped due to an error. Correcting the error may show that the bit actually did not change and so it may not be necessary to update the values of the associated ECC bits. In the illustrated embodiment, a multiplexer 230 is used to select between input from the full ECC logic 220 and the dedicated ECC logic 225. For example, a multiplexer 230 can be configured to receive the control signal that selects input from the dedicated ECC logic 225 as the output that is provided to the ECC bits in the cache lines 215 when only one or more of the state bits have changed.

One example of error correction code logic can be written (using Verilog format) as follows. The error correction code check bits are calculated using XOR (represented by a "^") of specific data bits:

$$EccCheck[0]=Data[1]\,\hat{}\,Data[2]\,\hat{}\,Data[3]$$

$$EccCheck[1]=Data[0]\,\hat{}\,Data[1]\,\hat{}\,Data[3]$$

In the interest of clarity only two error correction code check bit formulae are presented here, however, persons of ordinary skill in the art having benefit of the present disclosure should appreciate that additional error correction code check bits can be calculated using other data elements. If the value of Data [1] changes (either from 0->1 or from 1->0), then both EccCheck[0] and EccCheck[1] should be flipped. If only the value of Data[0] changes, then only EccCheck[1] should change (as Data[0] is not part of the equation for EccCheck [0]). In this example, only Data [0] and Data[1] are part of the subset of bits that are coupled to the dedicated ECC logic 225. Since the dedicated ECC logic 225 only operates in response to changes in Data[0] or Data[1], the dedicated ECC logic 225 can compute the new EccCheck values from the old values:

$$newEccCheck[1:0]=oldEccCheck[1:0]\,\hat{}\,((oldData[0]\,\hat{}\,newData[0])?2'b10:2'b00)\,\hat{}\,((oldData[1]\,\hat{}\,newData[1])?2'b11:2'b00);$$

Thus, at the cost of implementing the dedicated logic 225 to flip individual ECC bits, the latency (and power) of re-computing the ECC bits from scratch can be reduced.

FIG. 3A conceptually illustrates one exemplary embodiment of a line 300 in a tag array. In the illustrated embodiment, the line 300 includes address bits 305, state bits 310, and ECC bits 315. The first error control code bit 320 is a function of the first state bit 325, and (optionally) one or more of the address bits 330. In the illustrated embodiment, the first error control code bit 320 is computed using an XOR function 335, although other functions may be used to combine the bits. As discussed herein, the one or more address bits 330 can be used to calculate the ECC bits that are functions of the state bits 310, but changes in the address bits 330 are not used to trigger or invoke the ECC logic that is dedicated to updating the ECC bits 315, 320 that are functions of the state bits 310.

FIG. 3B conceptually illustrates the exemplary embodiment of the line 300 in the tag array following a change in the state bit 325. In the illustrated embodiment, the dedicated ECC logic can access information indicating the "old" values of the bits. For example, copies of the state bits 310 can be stored in a register 340 that is either maintained in the dedicated ECC logic or can be accessed by the dedicated ECC logic. Old copies of the ECC bits (e.g., the values of oldEccCheck) can also be stored. A change in the value of the state bit 325 can be detected by comparing a copy 345 to the current value of the state bit 325. The first error control code bit 320 is computed using an XOR function logic 350 of a previous (old) value of the first error control code bit 320 and the old and new state bits 325, 345, although other functions may be used to combine the bits. For example, the dedicated ECC logic may use the XOR function logic 350 to implement the equation:

newEccCheck=oldEccCheck^oldData^newData

In other embodiments, values of the error control code bit 320 may be functions of more than one of the state bits 310. For example, the error control code bit 320 may be a function of two state bits 310 and so the dedicated ECC logic may use the XOR function logic 350 to implement the equation:

newEccCheck=oldEccCheck^(oldData[0]^newData
 [0]) ^(oldData[1]^newData[1])

In this example, the ECC bits 320 flip if either of the state bits 310 flips but not when both of these bits flip.

As discussed herein, a change in the state bit 325 causes dedicated ECC logic to update and/or modify the ECC bit 320 that is a function of the state bits 325. Since the dedicated ECC logic is only invoked in response to changes in one or more of the state bits 310 and is only used to update the ECC bits 320 that are functions of the state bits 310, the logic and clock cycles associated with performing a complete update of all of the ECC bits 315 can be saved and the latency associated with recomputing the ECC bits 320 can be reduced. Alternatively, e.g., in cases where the "from scratch" ECC calculation can be done in a single clock cycle, the "fast update" dedicated ECC logic may allow the clock cycle period to be reduced (leading to a higher clock cycle frequency). The number of clock cycles between the initial read and the update write may also be reduced.

Although the illustrated embodiment depicts a line 300 in a tag array, persons of ordinary skill in the art having benefit of the present disclosure should appreciate that this technique can also be used to reduce latency associated with updating error correction information associated with any type of data. For example, if a subset including a relatively small percentage (e.g., less than $\log_2$(total number of bits)) of a set of bits are expected to change relatively frequently compared to the other bits in the set of bits, then using dedicated logic to modify/update the ECC bits associated with the bits in the subset can reduce the latency associated with maintaining the ECC bits.

Figure 4:
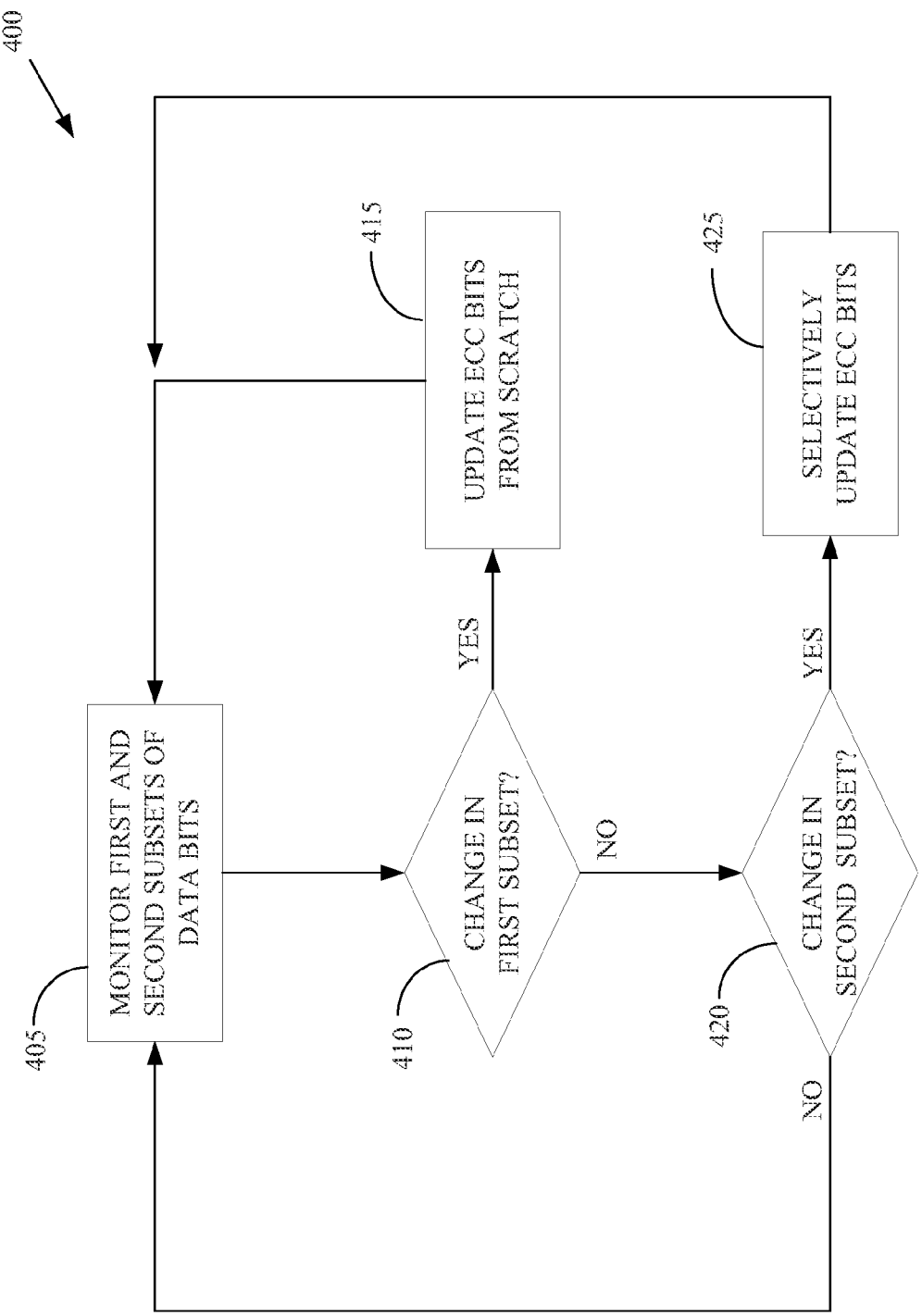
FIG. 4 conceptually illustrates one exemplary embodiment of a method of selectively updating error correction code (ECC) bits associated with a subset of a selected portion of data bits.

FIG. 4 conceptually illustrates one exemplary embodiment of a method 400 of selectively updating error correction code (ECC) bits associated with a subset of a selected portion of data bits. In the illustrated embodiment, a set of data bits is used store data and/or instructions and another set of ECC bits are used to store error correction code information that can be used to detect and/or correct errors in the set of data bits. The data bits may be divided into at least two mutually exclusive subsets and the bits in the first subset are expected to be changed, modified, and/or updated less frequently than the bits in the second subset. In the illustrated embodiment, dedicated logic monitors (at 405) the first and second subsets of data bits. If a change in one or more of the bits in the first subset is detected (at 410), then a complete update of the ECC bits can be performed (at 415), e.g., the ECC bits can be re-computed from scratch. As long as no changes in the first subset have been detected (at 410), other logic can monitor (at 405) the first and second subsets of data bits to determine whether one or more bits in the second subset have changed (at 420). When a change in the second subset is detected (at 420) then the dedicated ECC logic can selectively update (at 425) the ECC bits that are functions of the modified bits in the second subset. The dedicated logic only updates (at 425) the ECC bits in response to changes in bits within the second subset and does not perform any actions in response to changes in bits in the first subset. The dedicated logic and the other logic can continue to monitor (at 405) the first and second subsets of data bits as long as none of the bits in the second subset have changed (at 420).

Embodiments of processor systems that can calculate error correction codes for selected data updates as described herein (such as the processor system 100) can be fabricated in semiconductor fabrication facilities according to various processor designs. In one embodiment, a processor design can be represented as code stored on a computer readable media. Exemplary codes that may be used to define and/or represent the processor design may include HDL, Verilog, and the like. The code may be written by engineers, synthesized by other processing devices, and used to generate an intermediate representation of the processor design, e.g., netlists, GDSII data and the like. The intermediate representation can be stored on computer readable media and used to configure and control a manufacturing/fabrication process that is performed in a semiconductor fabrication facility. The semiconductor fabrication facility may include processing tools for performing deposition, photolithography, etching, polishing/planarizing, metrology, and other processes that are used to form transistors and other circuitry on semiconductor substrates. The processing tools can be configured and are operated using the intermediate representation, e.g., through the use of mask works generated from GDSII data.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. A method, comprising:
   responsive to a change in a first subset of a plurality of data bits, calculating a first subset of a plurality of error correction code bits, wherein the plurality of error correction code bits represent an error correction code value for the entirety of the plurality of data bits, wherein the first subset of the plurality of error correction code bits is less than all of the plurality of error correction code bits, wherein the plurality of data bits comprises lines of a tag array associated with a cache memory, each line comprising at least one state bit and a plurality of address bits, and wherein calculating the first subset of the plurality of error correction code bits comprises modifying the first subset of the plurality of error correction code bits of a line of the tag array in response to a change in the at least one state bit of the line without modifying a second subset of the plurality of error correction code bits;
   responsive to a change in at least one data bit outside of the first subset of data bits, calculating the first and second subsets of the plurality of error correction code bits; and
   determining the error correction code value for the entirety of the plurality of data bits.

2. The method of claim 1, wherein the first subset of the data bits comprises at least one data bit that is expected to be modified more frequently than data bits in a second subset of the data bits.

3. The method of claim 1 comprising writing values for the first subset of the plurality of error correction code bits without writing information for the second subset of the plurality of error correction code bits.

4. An apparatus, comprising:
   logic configured to be communicatively coupled to a first subset of a plurality of data bits stored in a memory and a first subset of error correction code bits, wherein the logic is configured to:
      responsive to a change in the first subset of the data bits, calculate the first subset of the error correction code bits without calculating a second subset of the error correction code bits, wherein the plurality of error correction code bits represent an error correction code value for the entirety of the plurality of data bits, wherein the first subset of the plurality of error correction code bits is less than all of the plurality of error correction code bits, wherein the memory comprises lines of a tag array associated with a cache memory, each line comprising at least one state bit and a plurality of address bits, and wherein the first subset of the data bits includes the at least one state bit of a line of the tag array and does not include the address bits of the line; and
   logic configured to:
      responsive to a change in at least one bit that is outside the first subset of the data bits, calculate the first subset and second subsets of the error correction code bits.

5. The apparatus of claim 4, wherein the plurality of data bits comprises a second subset of the data bits, and wherein the first and second subsets of the data bits are mutually exclusive.

6. The apparatus of claim 5, wherein the first subset of the data bits comprises at least one data bit that is expected to be modified more frequently than data bits in the second subset of the data bits.

7. The apparatus of claim 4, wherein the logic to calculate the first subset of the error correction code bits is configured to write values for the first subset of the error correction code bits without writing information for the second subset of the error correction code bits.

8. An apparatus, comprising:
   a tag array comprising at least one state bit, a plurality of address bits, and a plurality of error correction code bits representing an error correction code value for the entirety of said at least one state bit and the address bits; and
   logic that is communicatively coupled to said at least one state bit and a first subset of the error correction code bits and configured to:
      calculate the first subset of the error correction code bits in response to a change in said at least one state bit, wherein a second subset of the error correction code bits is not calculated in response to the change in said at least one state bit; and
   additional logic configured to modify the first subset and the second subset of the error correction code bits in response to a change in at least one bit that is outside the first subset of the error correction code bits.

9. The apparatus of claim 8, wherein said at least one state bit is expected to be modified more frequently than the address bits.

10. The apparatus of claim 8, wherein the logic is configured to write values for the first subset without writing information for the second subset.

11. A non-transitory computer readable media including instructions that when executed can configure a manufacturing process used to manufacture a semiconductor device comprising:
  logic configured to be communicatively coupled to a first subset of a plurality of data bits stored in a memory and a first subset of a plurality of error correction code bits, wherein the plurality of error correction code bits represent an error correction code value for the entirety of the plurality of data bits; wherein the logic is configured to calculate the first subset of the error correction code bits in response to a change in the first subset of the data bits, wherein the first subset of the plurality of error correction code bits is less than all of the plurality of error correction code bits, wherein the memory comprises lines of a tag array associated with a cache memory, each line comprising at least one state bit and a plurality of address bits, and wherein the first subset of the data bits includes said at least one state bit of a line of the tag array and does not include the address bits of the line; and
  logic configured to calculate the first subset of the error correction code bits and a second subset of the error correction code bits in response to a change in at least one bit that is outside the first subset of the data bits.

12. The computer readable media set forth in claim 11, wherein the computer readable media is configured to store at least one of hardware description language instructions or an intermediate representation of said logic.

13. The computer readable media set forth in claim 12, wherein the instructions when executed configure generation of lithography masks used to manufacture said logic.

\* \* \* \* \*